(12) United States Patent
Lai et al.

(10) Patent No.: US 7,852,133 B2
(45) Date of Patent: Dec. 14, 2010

(54) PHASE-LOCKED LOOP (PLL) HAVING EXTENDED TRACKING RANGE

(75) Inventors: Yhean-Sen Lai, Warren, NJ (US); Jie Song, Germantown, MD (US); Zhenyu Wang, Bethlehem, PA (US); Jinguo Yu, Flemington, NJ (US)

(73) Assignee: Agere Systems Inc., Allentown, PA (US)

( * ) Notice: Subject to any disclaimer, the term of this patent is extended or adjusted under 35 U.S.C. 154(b) by 355 days.

(21) Appl. No.: 12/159,246

(22) PCT Filed: Sep. 28, 2007

(86) PCT No.: PCT/US2007/079900
§ 371 (c)(1),
(2), (4) Date: Jun. 26, 2008

(87) PCT Pub. No.: WO2009/041978
PCT Pub. Date: Apr. 2, 2009

(65) Prior Publication Data
US 2010/0253400 A1    Oct. 7, 2010

(51) Int. Cl.
H03L 7/06    (2006.01)
(52) U.S. Cl. ........................ 327/158; 327/149
(58) Field of Classification Search ................. 327/149, 327/158
See application file for complete search history.

(56) References Cited

U.S. PATENT DOCUMENTS

| | | | |
|---|---|---|---|
| 6,181,211 B1 | 1/2001 | Aho et al. | |
| 6,683,928 B2 * | 1/2004 | Bhullar et al. | 375/374 |
| 6,853,261 B1 | 2/2005 | Ling | |
| 6,879,196 B2 * | 4/2005 | Lutkemeyer | 327/161 |
| 7,049,868 B2 * | 5/2006 | Lutkemeyer | 327/161 |
| 7,236,028 B1 * | 6/2007 | Choi | 327/158 |
| 7,696,799 B2 * | 4/2010 | Kim | 327/158 |
| 7,755,437 B2 * | 7/2010 | Ballantyne et al. | 331/17 |
| 2002/0008588 A1 | 1/2002 | Khan | |
| 2005/0174185 A1 | 8/2005 | Steinbach et al. | |
| 2007/0018745 A1 | 1/2007 | Knotts et al. | |
| 2007/0069780 A1 * | 3/2007 | Kim | 327/158 |
| 2007/0290912 A1 * | 12/2007 | Lynch et al. | 341/144 |
| 2008/0074539 A1 * | 3/2008 | Lee | 348/465 |
| 2008/0143405 A1 * | 6/2008 | Bhullar et al. | 327/158 |
| 2010/0039148 A1 * | 2/2010 | Petrie | 327/149 |
| 2010/0183091 A1 * | 7/2010 | Wang et al. | 375/296 |

FOREIGN PATENT DOCUMENTS

WO    PCT/US2007/079900    6/2008

* cited by examiner

*Primary Examiner*—Lincoln Donovan
*Assistant Examiner*—Adam D Houston
(74) *Attorney, Agent, or Firm*—Ryan, Mason & Lewis, LLP

(57) ABSTRACT

A method for extending a tracking range of a PLL includes the steps of: establishing an initial tracking window of the PLL, the tracking window having a first width associated therewith; and dynamically adjusting the tracking window of the PLL within an extended tracking range when a frequency of an input signal supplied to the PLL is outside of the tracking window, the extended tracking range having a second width associated therewith which is greater than the first width.

22 Claims, 5 Drawing Sheets

FO IS MOVEABLE IN THE RANGE (−L, L)

INITIAL SCAN FOR THE FREQUENCY ACQUISITION

PHASE-LOCKED LOOP (PLL) HAVING EXTENDED TRACKING RANGE

FIELD OF THE INVENTION

The present invention relates generally to electronic circuits, and more particularly relates to techniques for enhancing the performance of a PLL.

BACKGROUND OF THE INVENTION

A PLL is a well-known frequency-selective feedback system which is adapted to generate a signal which can synchronize with a reference input signal and closely track the frequency changes which may be associated with the input signal. PLLs are utilized in numerous applications, including communication, telemetry and data-recovery applications.

The range of frequencies over which the PLL can maintain synchronization with an input signal is typically defined as the tracking range, or lock range, of the system. This is different from the range of frequencies over which the PLL can first synchronize with the incoming signal, the latter range of frequencies being typically known as the capture range, or acquisition range, of the PLL. The capture range is characteristically always smaller than the tracking range in practical PLL circuits. Generally, the larger the tracking range of the PLL, the worse is the performance of the PLL. Ideally, a narrow tracking range is desirable in order to rapidly capture the input signal and to hold the frequency of the input signal more precisely while in lock. However, a narrow tracking range does not allow the PLL to maintain synchronization with the incoming signal over fluctuations in the frequency of the incoming signal, in addition to variations in operating conditions and/or manufacturing characteristics to which the PLL may be subjected, such as, for example, process, voltage supply and/or temperature (PVT).

In a satellite digital audio radio service (SDARS) application, a costly temperature compensated crystal oscillator (TCXO) is often employed to reduce the amount of frequency offset in the SDARS receiver. A high cost TCXO will typically exhibit a frequency offset variation of about ±15 ppm (parts per million) over a temperature range from about −40 to about 105 degrees Celsius. By comparison, a lower cost crystal may exhibit a frequency offset variation of about ±55 ppm over the same temperature range. About ±20 ppm to about ±35 ppm of the total frequency offset variation in the lower cost crystal can be attributed to temperature change, while the remaining frequency offset variation may be due to a number of other factors, including, for example, manufacturing variations, aging, and variations in board components (e.g., loading capacitor) which affect a loading impedance of the crystal. While it would be desirable to utilize a lower cost crystal in order to reduce the overall cost of the SDARS receiver, the frequency offset variation of the lower cost crystal is too large to satisfy the stringent frequency tracking requirements of many applications, such as SDARS.

Accordingly, there exists a need for an improved PLL which does not suffer from one or more of the above-noted problems exhibited by conventional PLLs.

SUMMARY OF THE INVENTION

The present invention meets the above-noted need by providing, in illustrative embodiments thereof, techniques for extending the tracking range of a PLL. Moreover, techniques of the invention provide the ability to extend the frequency tracking range of the PLL without modifying any core hardware of the PLL. Consequently, using techniques of illustrative embodiments of the present invention, a crystal oscillator having a larger frequency offset tolerance, in comparison to higher cost TCXOs, can be utilized, thereby resulting in a significant cost savings.

In accordance with an embodiment of the invention, a method for extending a tracking range of a PLL includes the steps of: establishing an initial tracking window of the PLL, the tracking window having a first width associated therewith; and dynamically adjusting the tracking window of the PLL within an extended tracking range when a frequency of an input signal supplied to the PLL is outside of the tracking window, the extended tracking range having a second width associated therewith which is greater than the first width.

The step of adjusting the tracking window of the PLL may include reading data from a first register connected to the PLL, the data in the first register being indicative of at least one of a frequency offset and a phase offset of the PLL relative to the frequency of the input signal, and controlling a center frequency of the tracking window of the PLL as a function of the data read from the first register. Data indicative of an offset value to be added to or subtracted from a present value of the center frequency of the tracking window may be stored in a second register. The offset value stored in the second register may be added to the present value of the center frequency of the tracking window when the frequency of the input signal is greater than a current maximum frequency of the tracking window, and the offset value may be subtracted from the present value of the center frequency when the frequency of the input signal is less than a current minimum frequency of the tracking window.

In accordance with another embodiment of the invention, an apparatus for extending a tracking range of a PLL includes a processor operative: to establish an initial tracking window of the PLL, the tracking window having a first width associated therewith; and to dynamically adjust the tracking window of the PLL within an extended tracking range when a frequency of an input signal supplied to the PLL is outside of the tracking window, the extended tracking range having a second width associated therewith which is greater than the first width.

These and other objects, features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative PLL circuit. It should be understood, however, that the present invention is not limited to this or any other particular circuit arrangements. Rather, the invention is more generally applicable to techniques for beneficially extending a tracking range of a PLL, in at least one aspect, by dynamically controlling a center frequency of a tracking window corresponding to the PLL so as to maintain lock with an incoming signal to the PLL over a wider frequency range. A width of the PLL tracking window is generally fixed and is optimally narrower for obtaining performance benefits. Techniques of the invention allow the PLL to beneficially retain the advantages of a narrower tracking window while being able to maintain signal lock over a wider range of frequencies of the input signal. Embodiments of the present invention advantageously facilitate compensation of the PLL for post-production variations, including but not limited to temperature, voltage and component aging.

Figure 1:
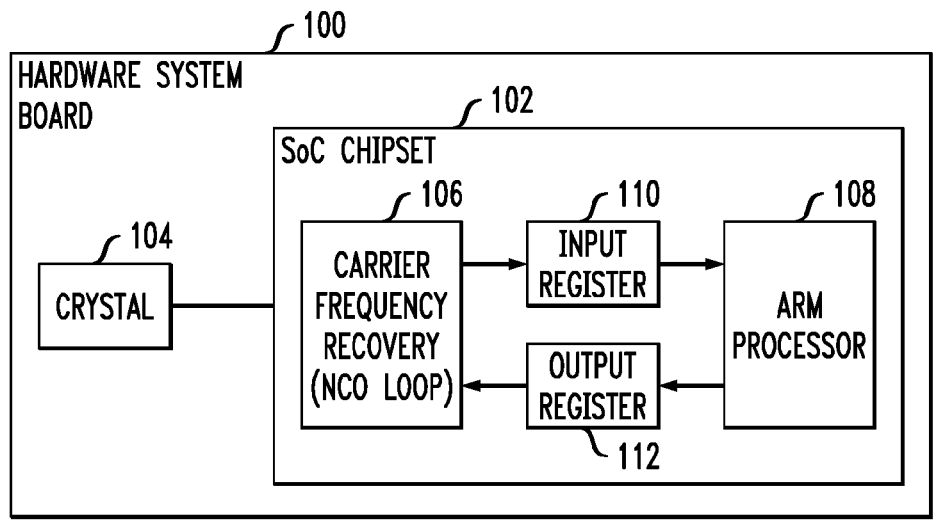
FIG. 1 is a block diagram depicting at least a portion of an exemplary application hardware system board in which techniques of the present invention may be implemented.

FIG. 1 is a block diagram depicting at least a portion of an exemplary application hardware system board 100 in which techniques of the present invention may be implemented. System board 100, which may be used, for example, in a SOARS receiver, includes a system-on-chip (SoC) chipset 102 and a crystal 104 connected to the chipset 102. Chipset 102 preferably includes a carrier frequency recovery circuit 106, which may be implemented as a numeric controlled oscillator (NCO) loop, described in further detail below with reference to FIG. 2. Chipset 102 further includes an advanced RISC (reduced instruction set code) machine (ARM) processor 108, or an alternative processor, which is operatively connected to the carrier frequency recovery circuit 106 by way of an input register 110 and an output register 112, each of the input and output registers being connected between the carrier frequency recovery circuit and the processor.

It is to be appreciated that the term "processor" as used herein is intended to include any processing device, such as, for example, one that includes a central processing unit (CPU), state machine, application-specific integrated circuit (ASIC) and/or other processing circuitry (e.g., digital signal processor (DSP), microprocessor, etc.). Additionally, it is to be understood that the term "processor" may refer to more than one processing device, and that various elements associated with a processing device may be shared by other processing devices.

Processor 108 is configured, at least in part, to perform inventive methodologies for extending an input signal tracking range of the carrier frequency recovery circuit 106, as will be described in further detail below. The input and output registers 110, 112 provide access to and from, respectively, processor 108. Specifically, input register 110 functions, at least in part, as an interface to store input information from the carrier frequency recovery circuit 106 to be utilized by processor 108. Processor 108 uses the input information stored in the input register 110, at least in part, in performing methodologies of the invention. Results generated by processor 108 may be stored in the output register 112 and subsequently utilized for dynamically controlling a tracking range of the carrier frequency recovery circuit 106, in accordance with methodologies of the invention. Crystal 104 provides a reference clock source which drives the chipset 102.

Figure 2:
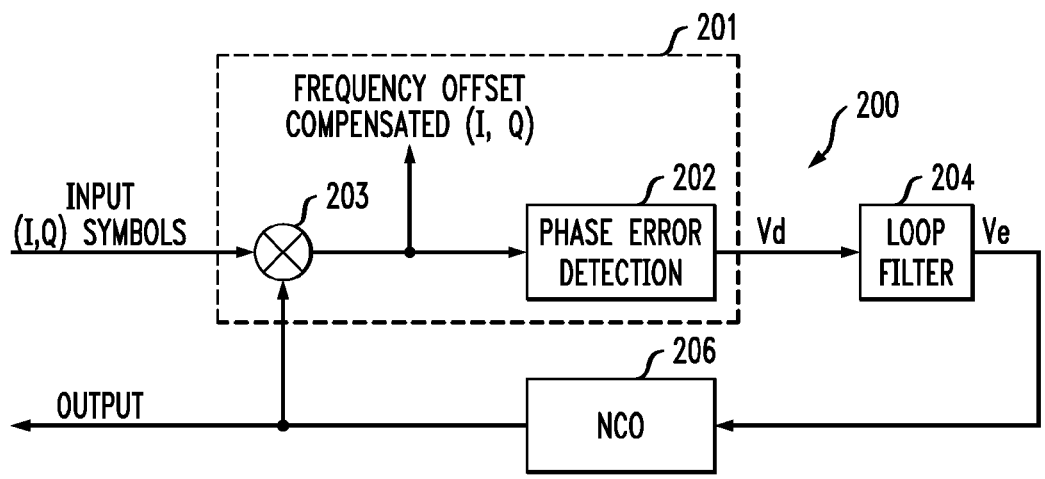
FIG. 2 is a block diagram depicting an exemplary PLL circuit which may be employed in the carrier frequency recovery circuit shown in FIG. 1, in accordance with an embodiment of the invention.

FIG. 2 is a block diagram depicting an exemplary PLL 200 which may be employed in the carrier frequency recovery circuit 106 shown in FIG. 1, in accordance with an embodiment of the invention. The basic functional blocks of PLL 200 include a phase detector 201, or an alternative phase-frequency detector (PFD), a loop filter 204 (e.g., low-pass filter, band-pass filter, etc.), and a NCO 206, or alternative controllable oscillator (e.g., voltage controlled oscillator (VCO), variable frequency oscillator (VFO), etc.), interconnected to form a closed loop feedback system, as shown. Phase detector 201 may be implemented by a phase error detection circuit 202 having an input connected to an output of a mixer 203, which in turn operatively combines the input signal with an output signal generated by NCO 206. The signal generated at the output of mixer 203 may be considered a frequency offset compensated signal. Alternative phase and/or frequency detection circuitry is similarly contemplated. Phase detector 201 is operative to compare the phase of a periodic input signal, which may comprise in-phase (I) and quadrature (Q) components (e.g., symbols), with a frequency of the output signal generated by the NCO 206 and to generate an error signal, which may be error voltage, Vd, as a function thereof. In this embodiment, it is assumed that the input signal has already been down-converted to base band, although this is not a requirement of the invention. The error voltage Vd is then filtered by loop filter 204 and is applied to a control input of NCO 206 in the form of a filtered error signal, which may be a filtered error voltage, Ve, to control the frequency of the output signal generated by the NCO.

Normally, with no input signal applied to PLL 200, the filtered error voltage Ve in the feedback loop will be substantially equal to zero. This is generally referred to as a free-running condition of the PLL, where the NCO 206 operates at a steady-state frequency equal to a free-running frequency, $f_0$, of the NCO. When a periodic input signal is applied to PLL 200 that is sufficiently close in frequency to the free-running frequency $f_0$ of NCO 206, the feedback nature of the PLL will cause a non-zero error voltage Vd to be generated, thereby forcing the NCO to synchronize with the frequency of the input signal. When this occurs, PLL 200 is said to be locked on the input signal frequency.

When PLL 200 is locked, the frequency of the output signal generated by NCO 206 will be substantially identical to the frequency of the input signal, except for a finite phase difference indicative of a frequency offset between the input signal applied to the PLL and the output signal generated by the NCO. This frequency offset may be due to, for example, frequency offset in the NCO, Doppler frequency shift, etc. The NCO output signal may therefore be considered to be an estimated frequency offset. This finite phase difference, often referred to as phase error, is necessary in order to generate the filtered error voltage Ve and thus maintain lock.

While in lock condition, PLL 200 is preferably able to track small variations in the frequency of the input signal. The magnitude of the filtered error voltage Ve necessary to maintain lock will be a function of (e.g., proportional to) a frequency shift of the input signal, relative to the free-running frequency $f_0$ of NCO 206. While the PLL is tracking an input signal, the error voltage Ve will be indicative of the frequency difference between the input signal and the NCO free-running frequency $f_0$. As previously stated, the tracking range of a PLL may be defined as that range of frequencies, centered about the free-running frequency $f_0$ of the NCO, over which the PLL can track a given input signal once the PLL is locked. The free-running frequency $f_0$ of NCO 206 predominantly determines the nominal center frequency of the capture and lock ranges. Therefore, the accuracy and stability of the NCO are important.

Figure 3:
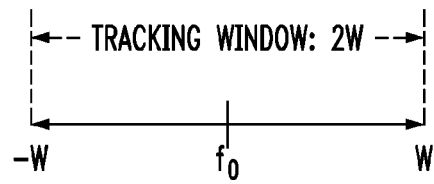
FIG. 3 illustrates an exemplary tracking window corresponding to the carrier frequency recovery circuit shown in FIG. 1.

Since the corrective error voltage Ve generated by loop filter 204 is limited to a prescribed range of voltage and/or current (e.g., voltage supply rails of the PLL), the amount of control over the phase and/or frequency of NCO 206 will also be limited. Thus, most PLLs have a limited tracking range, which may be referred to herein as a tracking window, within which the PLLs can track frequency variations of the input signal. The range of the error voltage Ve can be extended by adding gain to the feedback loop, although this range is generally limited to the voltage supply rails of the PLL circuit. FIG. 3 depicts an illustrative tracking window having a fixed range of 2W, where W represents a maximum frequency variation from a center frequency $f_C$ of NCO 206 over which the PLL 200 will maintain signal lock. Assuming $f_C$ is normalized to zero, the range of frequencies defining the tracking window will be [−W, W]. Thus, if the frequency of the input signal is within a frequency of W above or below the center frequency $f_C$ of the PLL ($f_C \pm W$), the PLL will remain locked. Likewise, when the frequency of the input signal is outside of the tracking window, the PLL will become unlocked.

With reference again to FIG. 2, once the PLL becomes unlocked, the PLL must be synchronized with the input signal again, also referred to as capturing or acquiring the input signal. A signal capturing procedure can take a considerable amount of time to perform, and therefore it is desirable to avoid having the PLL become unlocked. As previously stated, the capture range of a PLL is the range of frequencies over which the PLL can initially synchronize with the incoming signal. Since loop filter 204 functions, at least in part, to attenuate high-frequency components of the error voltage Vd in the PLL 200, the loop filter has a dominant effect on the capture and transient response characteristics of the PLL system. In order to improve performance in the PLL system, such as, for example, to improve interference rejection characteristics of the system, it is desirable to design the loop filter 204 to have a relatively narrow bandwidth. Unfortunately, however, the capture range of the PLL decreases as the loop filter bandwidth is reduced. Thus, some other mechanism is needed to allow the capture range to be beneficially increased without degrading performance of the PLL by increasing the bandwidth of the loop filter.

Figure 4:
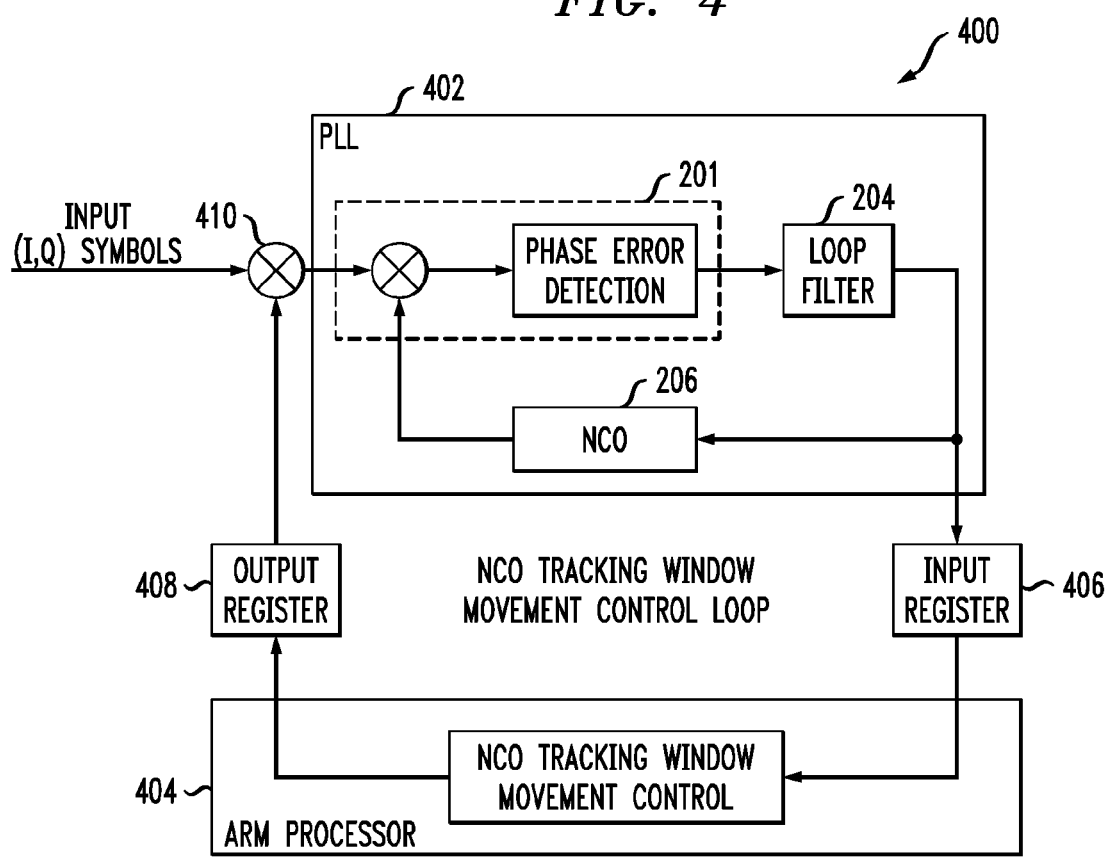
FIG. 4 is a block diagram depicting an exemplary PLL circuit having an extended tracking range, formed in accordance with an embodiment of the present invention.

FIG. 4 is a block diagram depicting an exemplary PLL circuit 400 having an extended tracking range, formed in accordance with an embodiment of the present invention. PLL circuit 400 advantageously extends the tracking range of a PLL included in circuit 400 without significantly degrading performance of the PLL. To accomplish this, illustrative embodiments of the invention are operative to detect when a frequency, fs, of an input signal supplied to the PLL circuit 400 is outside a current tracking window of the PLL and to dynamically modify a free-running frequency, F0, of an NCO, or alternative controlled oscillator, in PLL circuit 400, so as to establish a new tracking window. The new tracking window preferably has the same fixed width 2W, but has a center frequency which is substantially centered on the frequency fs of the input signal. In other embodiments of the invention, fs need not be centered in the tracking window; as long as fs resides somewhere in the window, the PLL will be able to track the input signal.

In effect, a second control loop, which may be referred to herein as a tracking window movement control loop, is added around the original NCO loop (e.g., the tracking window movement control loop comprises the NCO loop therein). Thus, the original fixed-width tracking window of the PLL is essentially left unchanged except for the value of the center frequency of the tracking window in an extended frequency tracking range. Techniques of the invention extend the effective tracking range from [−W, W] to [−(L+W), (L+W)], where L represents a maximum frequency variation from a center frequency of the extended tracking range within which the tracking window associated with the original NCO loop can move, preferably without changing the existing PLL circuitry.

PLL circuit 400 includes a PLL 402, which may be implemented in a manner similar to PLL 200 shown in FIG. 2 (e.g., including a phase detector 201, a loop filter 204, and a NCO 206), and an ARM processor 404, or alternative processor (e.g., controller, state machine, etc.), connected to the PLL 402 via an input register 406 and an output register 408. PLL circuit 400 further includes a mixer 410, or alternative combining arrangement, operative to combine an output signal generated by the output register 408 with the input signal supplied to the PLL circuit. As stated above with reference to FIG. 1, the input and output registers 406, 408 serve as an interface for passing data between PLL 402 and processor 404. More particularly, input register 406 functions, at least in part, to store input information, including, but not limited to, frequency offset information associated with the PLL 402 to be utilized by processor 404. Processor 404 uses the input information stored in the input register 406, at least in part, in performing methodologies of the invention. Results generated by processor 404, including, but not limited to, frequency offset adjustment information, may be stored in the output register 408 and subsequently utilized for dynamically controlling the tracking range of the PLL 402, in accordance with inventive techniques.

More particularly, processor 404 is preferably operative to store data in output register 408, the data in the output register being indicative of an offset value to be added to or subtracted from a present value of the center frequency of the tracking window. The offset value stored in output register 408 may then be added to the present value of the center frequency of the tracking window when the frequency of the input signal is greater than a current maximum frequency of the tracking window, or at least greater than a prescribed buffer zone within the tracking window. Likewise, the offset value stored in output register 408 may be subtracted from the present value of the center frequency of the tracking window when the frequency of the input signal is less than a current minimum frequency of the tracking window, or at least less than the buffer zone. In this manner, a new tracking window having a new center frequency and corresponding minimum and maximum boundary frequencies is established, with the frequency of the input signal falling within the new tracking window.

Mixer 410 is preferably operative to add the offset information stored in output register 408 to the input signal so as to ensure that the input signal remains within a prescribed buffer zone, which may be, for example, a range [−W/2, W/2] for a tracking window range of [−W, W], corresponding to PLL 402. The tracking window buffer zone may be dynamically controlled to adapt one or more tracking characteristics of the PLL circuit to environmental conditions to which the PLL circuit may be subjected. In an illustrative embodiment of the invention, mixer 410 comprises a multiplier coupled to a high-pass filter to remove subtraction components of the resulting signal, as will be known to those skilled in the art.

Figure 5:
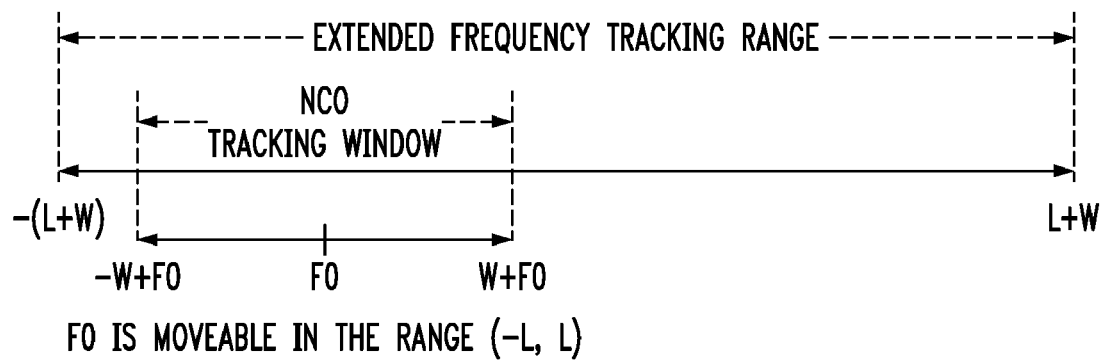
FIG. 5 illustrates an exemplary tracking window corresponding to the PLL circuit shown in FIG. 4.

An objective of the NCO loop in PLL 402 is to track the frequency of the input signal inside the tracking window having the fixed width of 2W and center frequency F0 normalized to zero hertz. Additionally, an objective of the tracking window movement control loop is to dynamically control the center frequency of the tracking window to a new position within an extended range [−L, L]. By way of illustration, FIG. 5 depicts an exemplary tracking window movement control methodology according to an embodiment of the invention. As apparent from the figure, the NCO loop tracking window is controlled such that its center frequency F0 is movable in the range [−L, L]. Before the tracking window movement control loop processing is initiated, the center frequency of the NCO loop tracking window is assumed to be normalized to zero, and therefore the tracking range is [−W, W], which is the width of the NCO loop tracking window. After the tracking window movement control loop processing, the center frequency of the NCO loop tracking window is adjusted to F0, and so the frequency offset tracking range is [−W+F0, W+F0]. Since the frequency F0 could be any position within the range [−L, L], the total tracking range within which the tracking window movement control loop can adapt to the input signal frequency change is effectively extended to [−(W+L), (W+L)].

Figure 6:
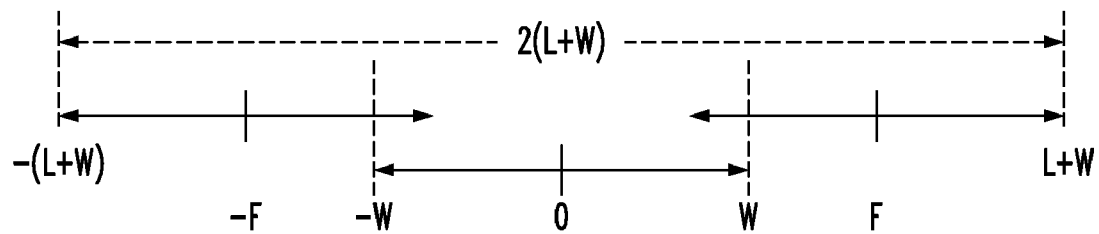
FIG. 6 depicts an illustrative acquisition methodology for initially scanning to lock the input signal, in accordance with an aspect of the invention.

Initially, for example, during circuit power-on reset or an alternative initialization event, the frequency of the input signal may be outside the tracking window of the NCO loop. When this occurs, the NCO loop cannot lock on the input signal and therefore PLL circuit cannot track frequency variations of the input signal. To solve this problem, an initial acquisition methodology may be performed in the PLL circuit. The acquisition methodology preferably enables the NCO loop to perform multiple scans using different center frequency positions for the tracking window. By way of example only, FIG. 6 depicts an illustrative acquisition methodology for initially scanning to lock the input signal, in accordance with an aspect of the invention. In this scenario, it is assumed that L<2W. As apparent from the figure, the PLL circuit preferably performs three scans with center window frequencies at −F, 0 and +F, respectively. These three tracking windows can cover the entire extended frequency range from −(L+W) to (L+W). It is to be understood that the invention is not limited to the number of scans that are performed. Rather, the number of scans which are required to cover the entire frequency range will be a function of, among other factors, the bandwidth of the tracking window of the NCO loop relative to the size of the extended PLL tracking range.

Figure 7:
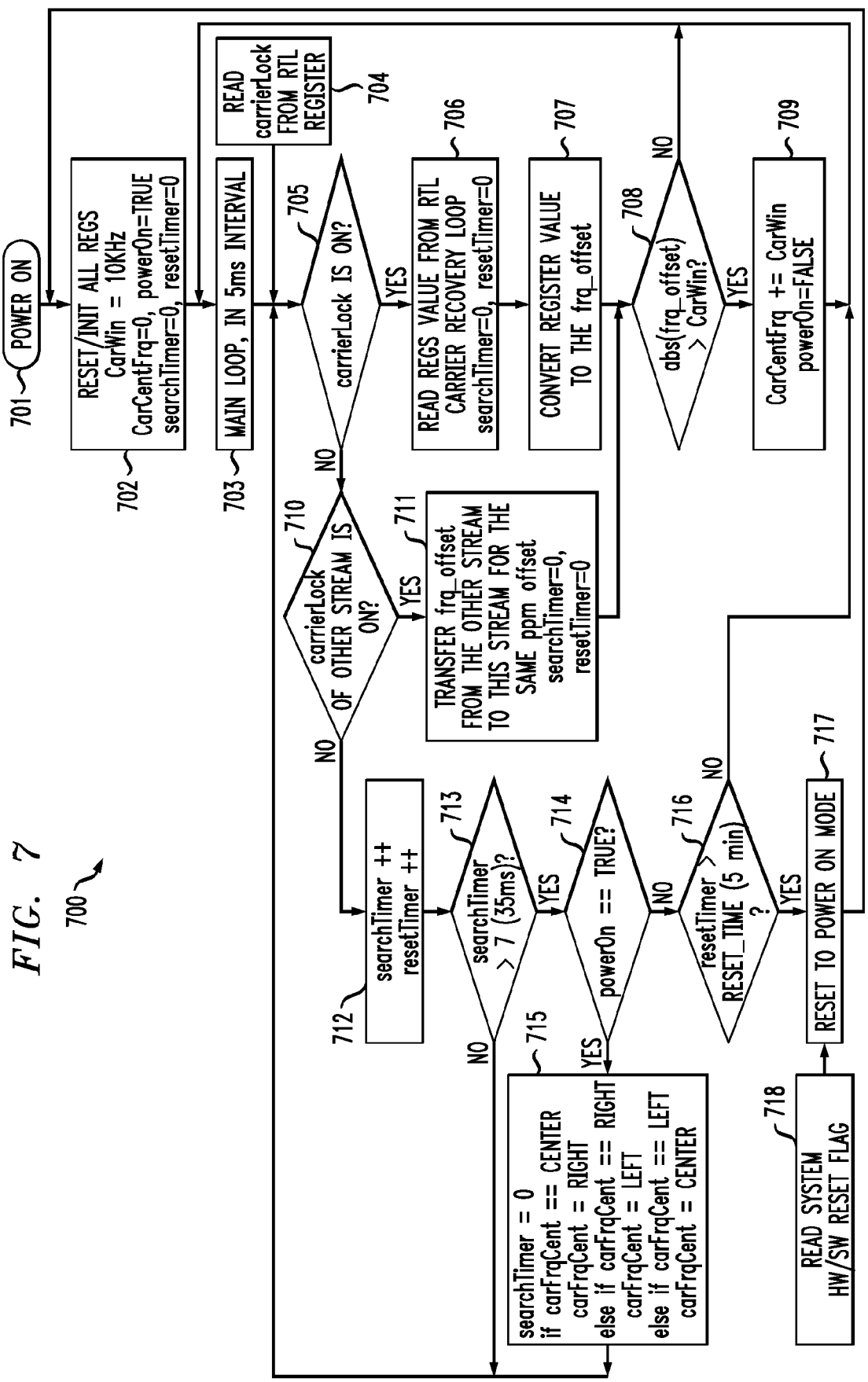
FIG. 7 is a flow diagram depicting an exemplary tracking window movement control methodology suitable for use in the illustrative PLL circuit shown in FIG. 4, in accordance with an embodiment of the invention.

By way of example only and without loss of generality, FIG. 7 is a flow diagram depicting an exemplary tracking window movement control methodology 700 suitable for use in the PLL circuit 400 shown in FIG. 4, in accordance with an embodiment of the invention. Tracking window movement control methodology 700 can be implemented, for example, in ARM processor 404 (see FIG. 4), although alternative arrangements for implementing the methodology are similarly contemplated. In a SDARS receiver application, there are three streams of data running in parallel, namely, TDM1, TDM2 and COFDM. The exemplary tracking window movement control methodology 700 may represent one of the three streams.

After a power-on condition (e.g., power-on reset) 701 is detected, tracking window movement control methodology 700 begins an initialization procedure in step 702 for resetting certain registers (e.g., input register 406 and output register 408 in FIG. 4) and for initializing certain parameters used by the methodology. For example, a variable, CarWin, may be used to set a size (width) of the fixed tracking window to a prescribed value, such as 10 kilohertz (KHz) in this example. Additionally, variable CarCentFrq may be used to set a center frequency of the tracking window to a prescribed value, such as zero in this example, variable powerOn may be set to TRUE indicating that a power-on condition was detected, and variables searchTimer and resetTimer, which may be used as counters in methodology 700, may be set to zero. Methodology 700 then proceeds to step 703, which is the start of a main tracking window movement control loop. The main control loop is performed in 5 millisecond (ms) intervals, although the invention is not limited to any specific time interval.

In the main control loop, a NCO lockup status is checked in step 704, such as by reading a carrierLock bit in a register transfer level (RTL) register. In step 705, methodology 700 checks the carrierLock bit to determine whether or not the NCO is locked on the current frequency of the input signal. When the NCO is determined to be locked on the input signal, the methodology proceeds to step 706. In step 706, a NCO tracked phase error value is read from the appropriate register and counters searchTimer and resetTimer are set to zero. Then, in step 707, the tracked phase error value is converted into a frequency offset value, frq_offset. Next, step 708 determines whether or not the frequency offset value is beyond the prescribed value CarWin, which is indicative of the input signal being outside the current NCO tracking window. When an absolute value (abs) of the frequency offset value frq_offset is not beyond the prescribed value CarWin, which indicates that the current center frequency of the tracking window is in an acceptable position within the tracking window, the tracking window movement control methodology does not need to modify the center frequency of the tracking window, and therefore method 700 proceeds back to step 703 to begin the next loop.

When the absolute value of the frequency offset value frq_offset is beyond the prescribed value CarWin, which indicates that the current center frequency of the tracking window is not in an acceptable position within the tracking window, the tracking window movement control methodology 700, in step 709, moves the center frequency of the NCO tracking window by the frequency offset value, thereby making the new center position of the tracking window substantially equal to the current frequency of the input signal. In step 709, the variable powerOn is also set to FALSE and method 700 proceeds back to step 703 to begin the next loop.

In step 705, when the NCO loop is determined not to be locked on the input signal, the methodology 700 proceeds to step 710. Step 710 determines whether or not another PLL circuit corresponding to another of the data streams (TDM1, TDM2, or COFDM) is locked on the corresponding data stream. If so, step 711 transfers the frequency offset value associated with the other data stream and uses this offset value to set an initial frequency offset frq_offset of the NCO loop corresponding to the current data stream. The respective center frequencies of the tracking windows corresponding to the three data streams should be closely related, assuming each of the data streams is affected by crystal offset, and thus using the frequency offset value of one data stream should provide a good approximation for the frequency offset value of the current data stream.

In this example, the frequency offset caused by a crystal oscillator in the SDARS receiver in a given one of the three data streams, which may contribute up to about 80 percent of the total tracking window frequency range requirements [−(L+W), (L+W)], will generally have substantially the same, or at least a fixed, relationship relative to respective crystal offset values for the other data streams. The frequency offset caused by Doppler frequency shift for a given one of the three data streams, which may contribute up to about 20 percent of the total tracking window frequency range requirements for the given data stream, will generally be substantially independent of respective Doppler frequency offsets for the other data streams. In the illustrative example, the PLL tracking window range [−W, W] is about two times larger than a maximal Doppler frequency offset range. Therefore, when using the PLL center frequency of another data stream as an estimated center frequency for the current data stream, the PLL tracking window range [−W, W] should be wide enough to cover the Doppler frequency offset difference between the two data streams.

In step 711, the counters searchTimer and resetTimer are also set to zero. The method then proceeds to step 708 to determine whether the frequency offset value frq_offset is beyond the prescribed value CarWin, as previously described.

In step 710, when another PLL circuit corresponding to another of the data streams (TDM1, TDM2, or COFDM) is not locked on the corresponding data stream, method 700 proceeds to step 712, wherein counters searchTimer and resetTimer are incremented. The counter searchTimer is used to keep track of the amount of time the NCO loop searches for the input signal without success.

In the present example, there are preferably three different operational modes for searching and subsequently locking on the input signal. In the first mode, which may be employed when the value of counter searchTimer is less than a first threshold, the PLL circuit is operative to reuse all of the previous information, such as, for example, register data and data associated with the other data streams. This is, perhaps, the fastest search method. In the second mode, which may be employed when the value of counter searchTimer is greater than the first threshold but less than a second threshold corresponding to the counter resetTimer, the PLL circuit is operative to reuse only part of the previous information that can be verified, and a multiple range search may be performed. In the third mode, which may be employed when the counter resetTimer is greater than the second threshold, all of previous information is reset (e.g., to zero) and the PLL circuit is restarted to initially search for the input signal, in a manner consistent with a power-on condition. This is to prevent system lockup on old information which may be invalid. It is to be understood that the invention is not limited to the specific number of operational modes described herein.

The value of searchTimer is then checked in step 713 to determine whether or not the prescribed second threshold value has been exceeded. The second threshold value having been exceeded is indicative of the input signal not being within the current tracking window. In the illustrative example shown in FIG. 7, the prescribed threshold value is 7, which is indicative of a search time of 35 ms (7 loops×5 ms loop interval). It is to be appreciated, however, that the invention is not limited to any particular search time. When a determination is made that the value of searchTimer has not exceeded the prescribed threshold value, method 700 continues back to step 705 to begin another loop. When the prescribed threshold value has been exceeded, method 700 proceeds to step 714 where the variable powerOn is checked to determine whether it is set to TRUE, which is indicative of the power being turned on in the PLL circuit.

When step 714 determines that power is on, control proceeds to step 715. In step 715, the center frequency of the tracking window, controlled by the variable carFrqCent, is moved to a different position, such as CENTER, LEFT or RIGHT, depending on the present position of the center frequency in the extended tracking range. Unlike the variable CarCentFrq, which represents the actual center frequency of the PLL, which may be essentially any decimal value and is preferably dynamically updated, the variable carFrqCent may be used to represent one of a number of predefined positions (e.g., three in the present illustrative example) for the tracking window. For example, when the center frequency of the tracking window is currently set to CENTER, the new center frequency is moved to RIGHT (e.g., F, shown in FIG. 6). When the center frequency is currently set to RIGHT, the new center frequency is moved to LEFT, and when the center frequency is currently set to LEFT, the new center frequency is moved to CENTER. It is to be understood that the resolution of the change in center frequency of the tracking window is not limited to any particular value. As the resolution increment is made smaller, the number of center frequency adjustments that may be made will increase accordingly. In order to speed the amount of time in which a new center frequency of the tracking window is selected, various methodologies may be employed, such as, for example, the use of successive approximation techniques, as will become apparent to those skilled in the art from the teachings herein. Once a new center frequency of the tracking window is set in step 715, method 700 proceeds back to step 705.

When step 714 determines that power is not turned on, which implies that the receiver tracked the input signal, but just lost it and therefore needs reacquisition of the signal, method 700 proceeds to step 716. In this scenario, the system is allowed more time to reacquire the input signal within the current tracking window before a change in the center frequency of the tracking window is made. Step 716 checks the counter resetTimer to determine whether or not a prescribed threshold value, RESET_TIME, has been exceeded. In this example, the prescribed searching time is five minutes, although the invention is not limited to any specific searching time value. When the searching time resetTimer is not greater than the prescribed threshold RESET_TIME, method 700 returns to step 703 to begin another loop. Alternatively, when the searching time resetTimer is greater than the prescribed threshold RESET_TIME, which means the input signal is truly lost, method 700 proceeds to step 717 which initiates a reset to power-on mode, and control then proceeds back to step 702 to perform a system initialization process to search for the input signal in the entire extended frequency range. At anytime, if a reset command is issued from step 718, the PLL system will also reset to power-on mode and re-establish the tracking loop.

Figure 8:
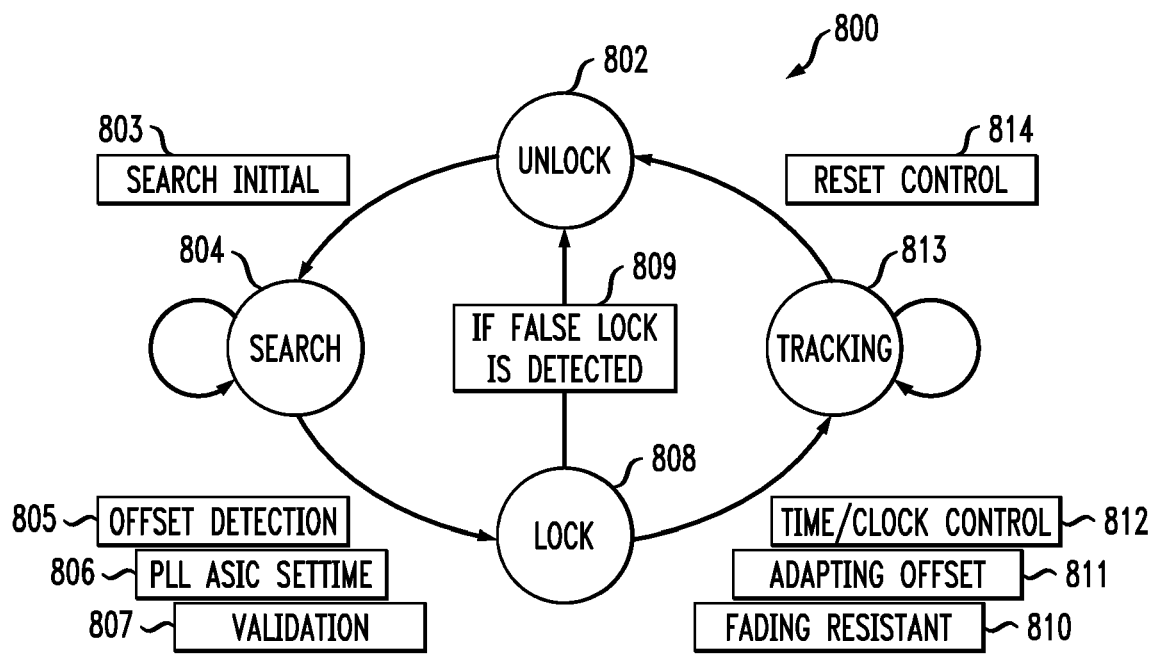
FIG. 8 is a state diagram depicting an exemplary methodology which may be optionally employed to reduce the likelihood that a false lock condition will occur, in accordance with an embodiment of the invention.

When the PLL center frequency shifts, the inventive tracking window movement control methodology may be used to move the PLL tracking window accordingly. However, when the input signal is weak and/or fading, the receiver may detect false information about the PLL frequency shifting and cause the PLL tracking window to move erroneously and possibly enter a false lock state. FIG. 8 is an illustrative state diagram 800 depicting an exemplary methodology which may be optionally employed to reduce the likelihood that a false lock condition will occur, in accordance with an aspect of the invention.

With reference to state diagram 800, it may be assumed that the PLL circuit is initially in an unlocked state 802, which may be entered, for example, during a power-on reset event, or an alternative initialization routine. From the unlocked state 802, control flow proceeds to a search state 804 where an initial search 803 for the input signal is performed. Control remains in the search state 804 until a frequency offset indicative of a lock condition is detected, at which point flow control proceeds to a lock state 808. While in the search state 804, the PLL circuit is preferably checked to verify that it is working in accordance with prescribed parameters. For example, frequency offset detection 805 may be performed by reading the offset data in the input register. A PLL ASIC (application-specific integrated circuit) settime routine 806 may be performed to set a delay latency of the PLL circuit for controlling when data is read from the input register. In an illustrative embodiment of the invention, the delay latency may be about 2 to 3 milliseconds (ms), assuming an input register update rate of about 1 ms. The invention, however, is not limited to any specific delay latency value or update rate. In a validation routine 807, the PLL circuit is operative to determine whether data in the input register is stable for a prescribed period of time, generally over several samples (e.g., 5 to 10).

In lock state 808, the lock condition is preferably re-evaluated after a prescribed period of time to determine whether or not the PLL is still locked to the input signal. Assuming no false lock condition is detected, flow control proceeds to a tracking state 813 wherein the PLL tracks frequency variations of the input signal within a prescribed buffer zone of the tracking window, such as, for example, within a range of [−W/2, W/2] based a tracking window size of [−W, W], in accordance with techniques of the invention. For example, in lock state 808, a fading resistant routine 810 may be performed wherein the PLL circuit is operative to check to verify that an average offset (e.g., based on a certain number of offset samples read from the input register) is still within the buffer zone of the tracking window, taking into account signal fading, etc. An adapting offset routine 811 may be performed wherein the PLL circuit is operative to change a size of the tracking window buffer zone as a function of certain signal characteristics, such as, for example, signal fading and/or signal quality. For instance, the tracking window buffer zone may be increased when signal fading is detected and/or when signal quality is below some prescribed threshold. In this manner, the PLL circuit is preferably operative to dynamically adapt signal tracking characteristics to the environment in which the PLL circuit is being used.

In the tracking state 813, the PLL circuit is operative to maintain lock with the input signal. Preferably, the center frequency of the tracking window is not changed as long as the input signal remains within the prescribed tracking window buffer zone, which may be in the range [−W/2, W/2], as previously explained. Once the frequency of the input signal is detected to be outside this buffer zone, the center frequency of the tracking window is changed so that the input signal is again within this buffer zone. If the input signal cannot be maintained within this buffer zone, a reset control routine 814 may be performed to initialize the PLL circuit and control proceeds to the unlock state 802 once again.

Figure 9:
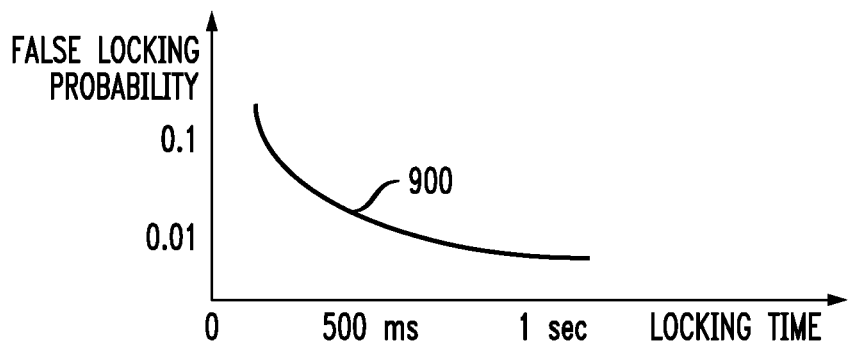
FIG. 9 is an exemplary graph depicting false locking probability as a function of locking time.

In lock state 808, the lock condition is preferably re-evaluated after a prescribed period of time to determine whether or not the PLL is still locked to the input signal, as previously explained. When a false lock is detected in routine 809, flow control proceeds back to the unlock state 802. FIG. 9 is an exemplary graph 900 depicting false locking probability as a function of locking time. As apparent from the figure, as the amount of time that the PLL remains locked to the input signal increases, the probability of the lock condition being a false lock decreases accordingly.

It is to be appreciated that while the present invention has been described herein in the context of an illustrative PLL circuit, methodologies of the present invention may be capable of being distributed in the form of computer readable media, and that the present invention applies equally regardless of the particular type of signal-bearing media actually used to carry out the distribution. The term "computer readable media" as used herein is intended to include recordable-type media, such as, for example, a floppy disk, a hard disk drive, RAM, compact disk (CD) ROM, flash memory, etc., and transmission-type media, such as digital and analog communication links, wired or wireless communication links using transmission forms, such as, for example, radio frequency and optical transmissions, etc. The computer readable media may take the form of coded formats that are decoded for use, for example, in a processor of a particular PLL system.

Accordingly, an application program, or software components thereof, including instructions or code for performing methodologies of the invention, as described herein, may be stored in one or more of the associated storage media (e.g., ROM, fixed or removable storage) and, when ready to be utilized, loaded in whole or in part (e.g., into RAM) and executed by the processor 404 (see FIG. 4). In any case, it is to be appreciated that at least some of the components of the invention, described herein and shown in the appended figures, may be implemented in various forms of hardware, software, or combinations thereof, e.g., one or more operatively programmed general purpose digital computers with associated memory, implementation-specific integrated circuit(s), functional circuitry, state machines, etc. Given the teachings of the invention provided herein, one of ordinary skill in the art will be able to contemplate other implementations of the components of the invention.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with the present invention can be employed in any application and/or electronic system which uses a PLL, or alternative frequency tracking means, for tracking the frequency of a periodic input signal. Suitable systems for implementing techniques of the invention may include, but are not limited to, satellite radio systems (e.g., SDARS), clock and data recovery (CDR) systems, communication networks, electronic instruments, etc. Systems incorporating such integrated circuits are considered part of this invention. Given the teachings of the invention provided herein, one of ordinary skill in the art will be able to contemplate other implementations and applications of embodiments of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method for extending a tracking range of a phase-locked loop (PLL), the method comprising the steps of
    establishing an initial tracking window of the PLL, the tracking window having a first width associated therewith; and
    dynamically adjusting the tracking window of the PLL within an extended tracking range when a frequency of an input signal supplied to the PLL is outside of the tracking window, the extended tracking range having a second width associated therewith which is greater than the first width.

2. The method of claim 1, wherein the first width is a function of one or more characteristics of the PLL.

3. The method of claim 1, wherein the step of adjusting the tracking window of the PLL comprises:
reading data from a first register connected to the PLL, the data in the first register being indicative of at least one of a frequency offset and a phase offset of the PLL relative to the frequency of the input signal; and
controlling a center frequency of the tracking window of the PLL as a function of the data read from the first register.

4. The method of claim 3, wherein the step of controlling the center frequency of the tracking window comprises the steps of:
storing data in a second register, the data in the second register being indicative of an offset value to be added to or subtracted from a present value of the center frequency of the tracking window;
adding the offset value to the present value of the center frequency of the tracking window when the frequency of the input signal is greater than a current maximum threshold frequency within the tracking window; and
subtracting the offset value from the present value of the center frequency of the tracking window when the frequency of the input signal is less than a current minimum threshold frequency within the tracking window.

5. The method of claim 1, wherein the step of adjusting the tracking window of the PLL comprises:
measuring the frequency of the input signal; and
setting a center frequency of the tracking window substantially equal to the frequency of the input signal.

6. The method of claim 1, further comprising the step of performing an initial scan for frequency acquisition of the input signal.

7. The method of claim 1, further comprising the steps of:
establishing a buffer zone within the tracking window of the PLL, the buffer zone having a third width which is less than the first width; and
dynamically adjusting the tracking window of the PLL when the frequency of the input signal falls outside of the buffer zone.

8. The method of claim 7, further comprising the step of dynamically controlling the third width so as to adapt one or more tracking characteristics of the PLL to one or more environmental conditions to which the PLL may be subjected.

9. The method of claim 1, wherein the step of adjusting the tracking window of the PLL comprises setting a current center frequency of the tracking window to one of a plurality of prescribed frequencies within the extended tracking range, each of the plurality of prescribed frequencies representing a new center frequency of the tracking window.

10. The method of claim 9, wherein the plurality of prescribed frequencies are spaced throughout the extended tracking range.

11. The method of claim 9, further comprising the steps of:
determining a difference between the frequency of the input signal and the current center frequency of the tracking window of the PLL; and
setting the current center frequency of the tracking window to one of the plurality of prescribed frequencies as a function of the difference between the frequency of the input signal and the current center frequency of the tracking window so as to establish the new center frequency of the tracking window.

12. The method of claim 1, further comprising the step of performing a false lock detection for reducing the likelihood that a false lock condition will occur in the PLL.

13. An article of manufacture for extending a tracking range of a phase-locked loop (PLL), the article of manufacture comprising a machine-readable storage medium containing one or more software programs that, when executed, implement the steps of claim 1.

14. An apparatus for extending a tracking range of a phase-locked loop (PLL), the apparatus comprising:
a processor operative: to establish an initial tracking window of the PLL, the tracking window having a first width associated therewith; and to dynamically adjust the tracking window of the PLL within an extended tracking range when a frequency of an input signal supplied to the PLL is outside of the tracking window, the extended tracking range having a second width associated therewith which is greater than the first width.

15. The apparatus of claim 14, wherein the processor is further operative: to read data from a first register connected to the PLL, the data in the first register being indicative of at least one of a frequency offset and a phase offset of the PLL relative to the frequency of the input signal; and to control a center frequency of the tracking window of the PLL as a function of the data read from the first register.

16. The apparatus of claim 15, wherein the processor is further operative: to store data in a second register, the data in the second register being indicative of an offset value to be added to or subtracted from a present value of the center frequency of the tracking window; to add the offset value to the present value of the center frequency of the tracking window when the frequency of the input signal is greater than a current maximum threshold frequency within the tracking window; and to subtract the offset value from the present value of the center frequency of the tracking window when the frequency of the input signal is less than a current minimum threshold frequency within the tracking window.

17. The apparatus of claim 16, further comprising a mixer adapted for connection to the PLL and connected to the processor, the mixer being operative to combine the offset value stored in the second register with the input signal.

18. The apparatus of claim 16, wherein the processor comprises at least one of the first and second registers.

19. The apparatus of claim 14, wherein the processor is further operative: to establish a buffer zone within the tracking window of the PLL, the buffer zone having a third width which is less than the first width; and to dynamically adjust the tracking window of the PLL when the frequency of the input signal falls outside of the buffer zone.

20. The apparatus of claim 19, wherein the processor is further operative to dynamically control the third width so as to adapt one or more tracking characteristics of the PLL to one or more environmental conditions to which the PLL may be subjected.

21. An integrated circuit, comprising at least one processor according to claim 14.

22. A phase-locked loop (PLL) circuit having an extended tracking range, the PLL circuit comprising:
a controllable oscillator operative to generate a first signal having a frequency which is controlled as a function of a first control signal applied thereto;
a phase-frequency detector having a first input for receiving an input signal supplied to the PLL circuit and a second input for receiving the first signal, the phase-frequency detector being operative to generate a second signal indicative of one of a phase difference and a frequency difference between the input signal and the first signal;

a filter connected to the phase-frequency detector and operative to receive the second signal and to generate the first control signal as a function of the second signal; and a processor operative: to establish an initial tracking window of a feedback loop comprising the controllable oscillator, the phase-frequency detector and the filter, the tracking window having a first width associated therewith; and to dynamically adjust the tracking window of the feedback loop within an extended tracking range when a frequency of the input signal supplied to the PLL circuit is outside of the tracking window, the extended tracking range having a second width associated therewith which is greater than the first width.

* * * * *